(12) United States Patent
Allen et al.

(10) Patent No.: US 7,194,726 B2
(45) Date of Patent: Mar. 20, 2007

(54) METHOD FOR AUTOMATICALLY DECOMPOSING DYNAMIC SYSTEM MODELS INTO SUBMODELS

(75) Inventors: Richard Craig Allen, Union City, CA (US); Randy A Coverstone, Newark, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 910 days.

(21) Appl. No.: 10/272,064

(22) Filed: Oct. 16, 2002

(65) Prior Publication Data

US 2004/0078180 A1    Apr. 22, 2004

(51) Int. Cl.
G06F 9/44 (2006.01)
G06F 17/50 (2006.01)

(52) U.S. Cl. ............................. 717/104; 717/107; 703/1

(58) Field of Classification Search ................... None
See application file for complete search history.

(56) References Cited

U.S. PATENT DOCUMENTS

| | | | | |
|---|---|---|---|---|
| 5,917,730 A | * | 6/1999 | Rittie et al. | 703/6 |
| 6,192,347 B1 | * | 2/2001 | Graff | 705/36 R |
| 6,243,706 B1 | * | 6/2001 | Moreau et al. | 707/101 |
| 2003/0028579 A1 | * | 2/2003 | Kulkarni et al. | 709/100 |

OTHER PUBLICATIONS

"Glossary of Terms", http://web.archive.org/web/20010608184707/http://www.orafaq.com/glossary/faqglosx.htm, p. 1.*

* cited by examiner

*Primary Examiner*—Wei Zhen
*Assistant Examiner*—Chih-Ching Chow
(74) *Attorney, Agent, or Firm*—Kyle J. Way

(57) ABSTRACT

A method for automatically decomposing a dynamic system model into separate submodels for ultimate execution on diverse target platforms is provided. Embodiments of the invention provide a way for a system designer to indicate which portions of a previously-specified system model are to become submodels. Optionally, the designer may also indicate the associated target platform for the execution of each submodel. A system submodel for each portion designated by the designer is generated, keeping all critical system-level information consistent throughout the entire system model. Each of these system submodels may then be employed to generate a software version of each system submodel. Each software submodel may then be transferred to its specified target platform and executed in cooperation with the other software submodels to effect an overall system simulation executing across the associated target platforms. Alternately, one or more system submodels may be replaced by the actual components of the dynamic system represented by those system submodels.

36 Claims, 6 Drawing Sheets

METHOD FOR AUTOMATICALLY DECOMPOSING DYNAMIC SYSTEM MODELS INTO SUBMODELS

BACKGROUND OF THE INVENTION

Dynamic systems, which are human-devised systems that respond in some beneficial way to changing conditions within their environment, represent a significant challenge to the designers of such systems due to the myriad and diverse conditions such systems must be capable of handling effectively. For example, electrical and electronic circuits, which represent but one type of dynamic system, often must react to ever-changing input signals by providing output signals based on the input signals, thereby causing some favorable action in the environment in which, the system operates. Electrical and electronic circuits are utilized to great advantage in a plethora of applications, from everyday consumer appliances, such as microwave ovens and personal computers, to high-tech military weaponry. Additionally, dynamic systems also include any type of software written to perform a specific, useful function. Furthermore, dynamic systems may include, but are not limited to, those based on electrical, software, mechanical, pneumatic, or chemical principles, or some combination thereof.

The task of designing dynamic systems has been greatly enhanced by continual improvements in the technology of system simulation. Such simulation allows models of dynamic system designs to be tested initially without the need of expensive prototypes that are difficult to both build and maintain. Through simulation, any imaginable set of test conditions may be employed to thoroughly exercise a preliminary system design. The results of those tests may then be used by the system designer to analyze the performance of the system. Typically, changes are then made based on the results of the tests, the tests are rerun, and the results are analyzed once again to determine the positive or negative effect of the changes. Thus, simulation allows the design of the dynamic system to be improved by way of an iterative process prior to the actual construction of the system under test, resulting in faster and more productive system development.

A specific example of such a modeling environment is the Simulink® system definition and simulation tool by The Mathworks, Inc. As shown in FIG. 2, a modeling environment 210 allows a system designer to specify a dynamic system, whether it is electrical, mechanical or otherwise, by way of a system model 1 possessing characteristics as determined by the designer. An example of the system model 1 is shown in FIG. 1. The system model 1 consists of several functional blocks 2, each of which performs some identifiable task within the system model 1. Each functional block 2 may be employed by the designer to designate an identifiable portion of the system model 1 that is implemented by way of a specific target, such as software executing on a digital signal processor (DSP), software running on a Win32 computing system, or an item of special purpose hardware, such as a digital-to-analog converter (DAC). Ordinarily, one or more input signals 3 and output signals 4 (or, collectively, external variables) are utilized by the dynamic system represented by the system model 1 to communicate with and influence the surrounding environment. Internal signals 5 of the system model 1 allow the functional blocks 2 to communicate, thereby allowing cooperation among the functional blocks 2 to perform the overall function of the dynamic system. Most modeling environments 210, such as Simulink, also allow hierarchical design, as each block 2 of the system model 1 may further consist of subblocks (not shown) representing various functions within the associated higher-level block 2.

Additionally, any functional blocks within the system model 1 may be predefined functional blocks (e.g., differentiation or integration functional blocks) that are normally made available within the modeling environment 210, while others are later-defined functional blocks whose behavior may be specified by the system designer. Such later-defined blocks may be specified within the Simulink environment by way of "S-functions," which allow the behavior of the block to be specified by way of user-supplied or third-party-supplied software, which may be written in any of several different languages, including C, Ada, and Fortran.

Each functional block 2 (and subblocks) of the system model 1 typically has associated with it various timing parameters and block priorities which help define the operational behavior of each functional block 2, especially as that behavior relates to that of other functional blocks 2 within the system model 1. Timing parameters indicate what period of time is required before an output of a functional block 2 (or subblock) changes state in response to a change at one of the inputs during simulation of the system model 1. Block priorities help determine which functional block 2 (or subblock) posts its change of output state first in the case that two functional blocks 2 may change output states simultaneously. Together, the timing parameters and block priorities of each of the functional blocks 2 determine an execution order for each functional block 2 over the entire system model 1.

As seen in FIG. 2, the system model 1 specified in the Simulink environment may then be simulated within that same environment using input signals 3 devised by the system designer. The analysis, subsequent design changes, and further simulation of the model normally all occur within the purview of the Simulink tool. To enhance this process, Simulink allows access to the internal signals 5 of the system model 1 that help define the behavior of the proposed system. Specifically, the internal signals 5 allow the designer more insight into the operations of the system model 1. Thus, access to these internal signals 5 makes the entire simulation and analysis process more efficient.

A related code-generation tool 220, such as that provided by The Mathworks, called the Real-Time Workshop® (RTW), takes system models 1 originally developed within the modeling environment 210 as input, and generates code that is a software model 230 representing the system model. The software model 230 can be generated in one of several different programming languages, including C, Ada, and others. The software model 230 may then be transferred to and executed on another platform, with the execution of the software model 230 possibly progressing in real-time, depending on the nature of the platform. In the case of software systems, the platform may be the target platform ultimately used to implement the system, thus providing a nearly seamless progression from system model generation to production-level code.

Most modeling environments only allow the generation of system models 1 that are monolithic in nature. In other words, each system model 1 specified by a designer is treated within the modeling environment as a single entity that is simulated en masse. Additionally, software models 230 that are generated from those system models 1 by way of a code-generation tool 220 also exhibit the same characteristic. However, many dynamic systems being developed today are not monolithic; that is, such systems often are implemented by way of a mixture of different types of hardware and software, each performing some different function. The collective operation of these various pieces ultimately allows the model system 1 to accomplish its desired end. For example, each of the functional blocks 2 of system model 1 (as shown in FIG. 1) may represent a portion of the system that is to be implemented on a different hardware/software platform. For example, FUNCTIONAL BLOCK 1 is to be implemented as software running on a Win32 computer system, FUNCTIONAL BLOCK 2 is firmware to be executed on an embedded microprocessing system, and FUNCTIONAL BLOCK 3 is software that is executed on a DSP. To more fully simulate each of these functional blocks 2, having a submodel associated with each section of the system that is to be implemented by way of a different platform would be advantageous, as simulation would be carried out on a platform that more closely approximates, and possibly duplicates, the ultimate implementation of the system. Additionally, breaking a simulation into several "submodels," each running on a separate platform, may also speed up more complex simulations, as the processing required would be distributed across multiple platforms running concurrently. Alternately, one or more of the submodels may be replaced by the actual component, such as an electric motor, that a particular submodel represents in order to more accurately test the overall system.

Currently, in order to enhance the simulation in such a manner, the system model 1 must be manually separated by the designer into separate system submodels, such as each of the functional blocks 2 of the system model 1. Each of the system submodels would then be used by way of a code-generation tool, such as RTW, to generate software submodels, each of which could then be simulated on separate target platforms.

Unfortunately, several problems arise as a result of manually generating the submodels. First, the process of generating the system submodels from the system model by hand leads to the possibility of errors being introduced into the submodels, as no automated connection exists between the original system model 1 and the submodels. Second, custom software must be added to each software submodel to provide for communication between the various submodels running on different target platforms.

Third, since at least some of the operational behavior of a submodel is determined by its interaction with the remainder of the system, those system-level characteristics that influence submodel behavior must be captured as a part of each submodel to allow the submodels to behave properly as a portion of the overall system. For example, the designer must ensure that each of the software submodels retains consistent timing parameters and block priorities, which determine the execution order in which the blocks are processed during a time step of the simulation. Otherwise, a simulation across the various software submodels may result in deadlock, which causes the simulation to halt prior to successful completion. Also, the types of data presented to each submodel may be determined by other portions of the system. Thus, unless each submodel is configured to accept the proper datatype, proper execution of the submodel is not likely, as that input data may be misinterpreted. These problems result from the separate system submodels being manually generated, as each such submodel is not generated and validated within the environment of the system model 1 as a whole. Also, changes made in the system model 1 are not reflected in earlier-generated system submodels, and vice-versa, resulting in separate, painstaking maintenance of both the system model 1 and system submodels.

Therefore, from the foregoing, methods that provide automatic decomposition of a system model into separate system submodels, as directed by a system designer, would be advantageous. Each system submodel could then potentially be employed to generate a software submodel which is executable on a target platform of the designer's choosing, thereby enhancing both the accuracy and the speed of the simulation of the integrated system.

SUMMARY OF THE INVENTION

Embodiments of the present invention, to be discussed in detail below, represent a method for automatically decomposing a system model into system submodels, thus allowing the simulation of the model to occur on multiple diverse target platforms simultaneously. As a precursor to the methods described below, the system designer organizes the system model into separate portions, each of which represents a particular system submodel that is to be executed on a target platform. Embodiments of the invention then provide a way for the designer to indicate which portions of the system model are to become submodels. Optionally, the user may also indicate the associated target platform for the execution of each submodel. Code provided by embodiments of the invention then generates a system submodel for each portion designated by the designer, keeping all critical system-level information, such as timing parameters and block priorities, consistent throughout the entire system model. Each of these system submodels may then be employed to generate a software submodel, which may then be transferred to the correct target platform for execution. Alternately, one or more system submodels may be replaced by the actual components of the system represented by those system submodels.

Several advantages may be associated with various embodiments of the invention. Since the generation of the system submodels is performed automatically, the possibility of mistakes being introduced into the system submodels is essentially eliminated. Also, all software that must be added to the software submodels to facilitate communication between the various submodels is generated automatically. Additionally, since the system model is employed directly to generate the system submodels, consistent timing parameters and block priorities between functional blocks within and between each submodel are maintained to avoid deadlock. Furthermore, since the system submodels are generated automatically from the system model, all changes to the system may be made solely at the system model level; changes to the submodels are taken care of automatically whenever the system submodels are built.

Other aspects and advantages of the invention will become apparent from the following detailed description, taken in conjunction with the accompanying drawings, illustrating by way of example the principles of the invention.

DETAILED DESCRIPTION OF THE PREFERRED EMBODIMENTS

Embodiments of the invention, as described in detail below, utilize as a starting point the Mathworks Simulink® modeling environment described above. However, other simulation model environments may be employed in a similar fashion as the basis for alternate embodiments of the present invention.

Furthermore, the software of alternate embodiments of the invention may be manifested in varying levels of integration with the associated modeling environment. For example, alternate embodiments may include distinct follow-on software that is installed separately from the modeling environment. Other embodiments, like those specifically discussed herein, may involve software developed independently, but integrated within the modeling environment. Also, other embodiments may represent code that is highly integrated to the point that such code is indistinguishable by an outside observer from that which comprises the remainder of the modeling environment.

Figure 4:
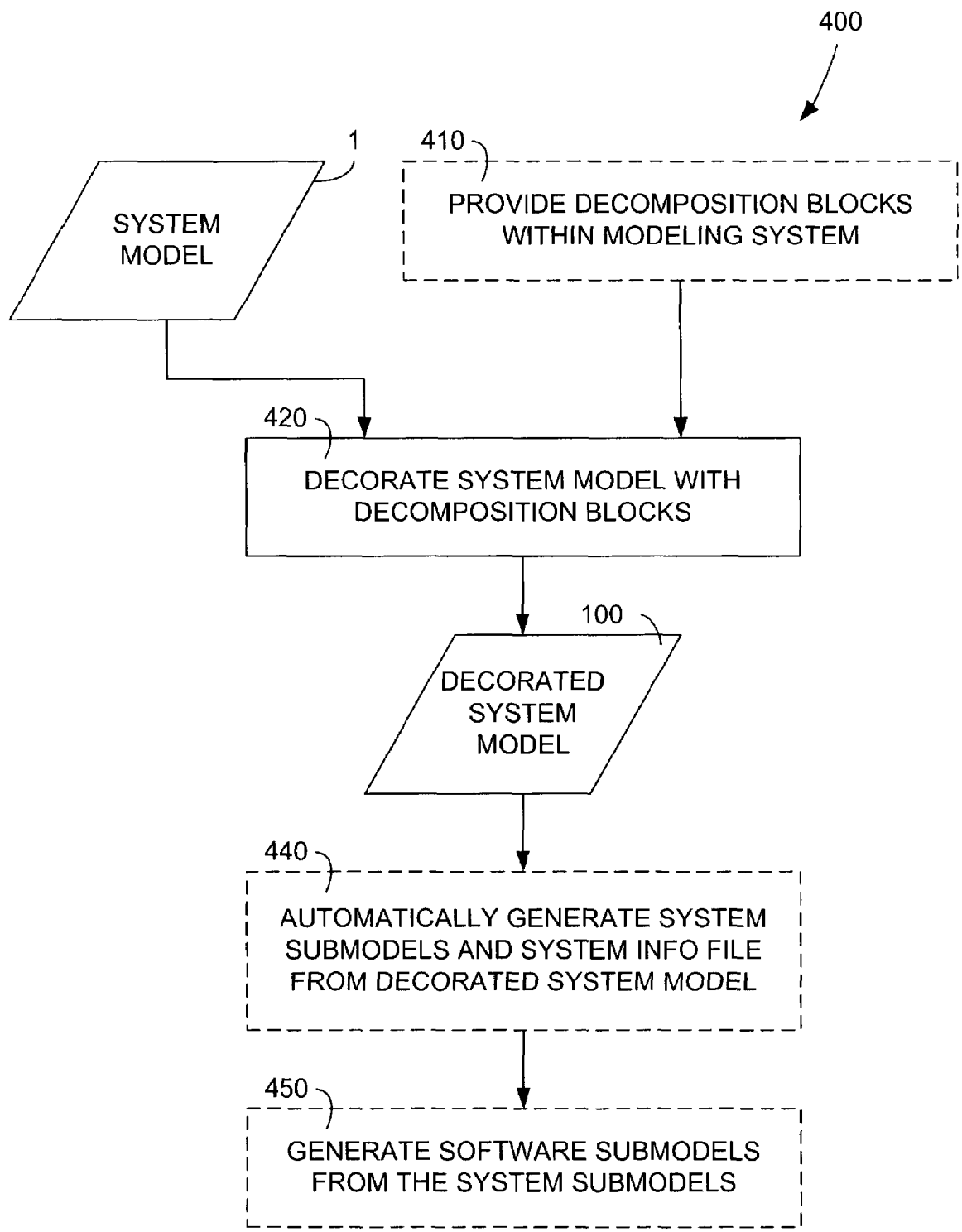
FIG. 4 is a flow chart of an overall integrated process of producing a system model, and decomposing that system model into associated system submodels and software submodels.

FIG. 4 shows an integrated representation 400 of the steps provided by embodiments of the invention, interspersed with steps performed by the system designer or other users. The steps directly associated with embodiments of the invention are indicated by way of blocks with dashed borders.

First, embodiments of the present invention provide a set of decomposition functional blocks 6, 7, and 8 (from FIG. 3) for use in a model defined by the designer (step 410 of FIG. 4). The decomposition functional blocks 6, 7, 8 typically are predefined blocks or third-party-defined blocks that reside in a library within the modeling environment. Like other functional blocks, the decomposition functional blocks 6, 7, 8 are available to be utilized and modified by the system designer.

Figure 1:
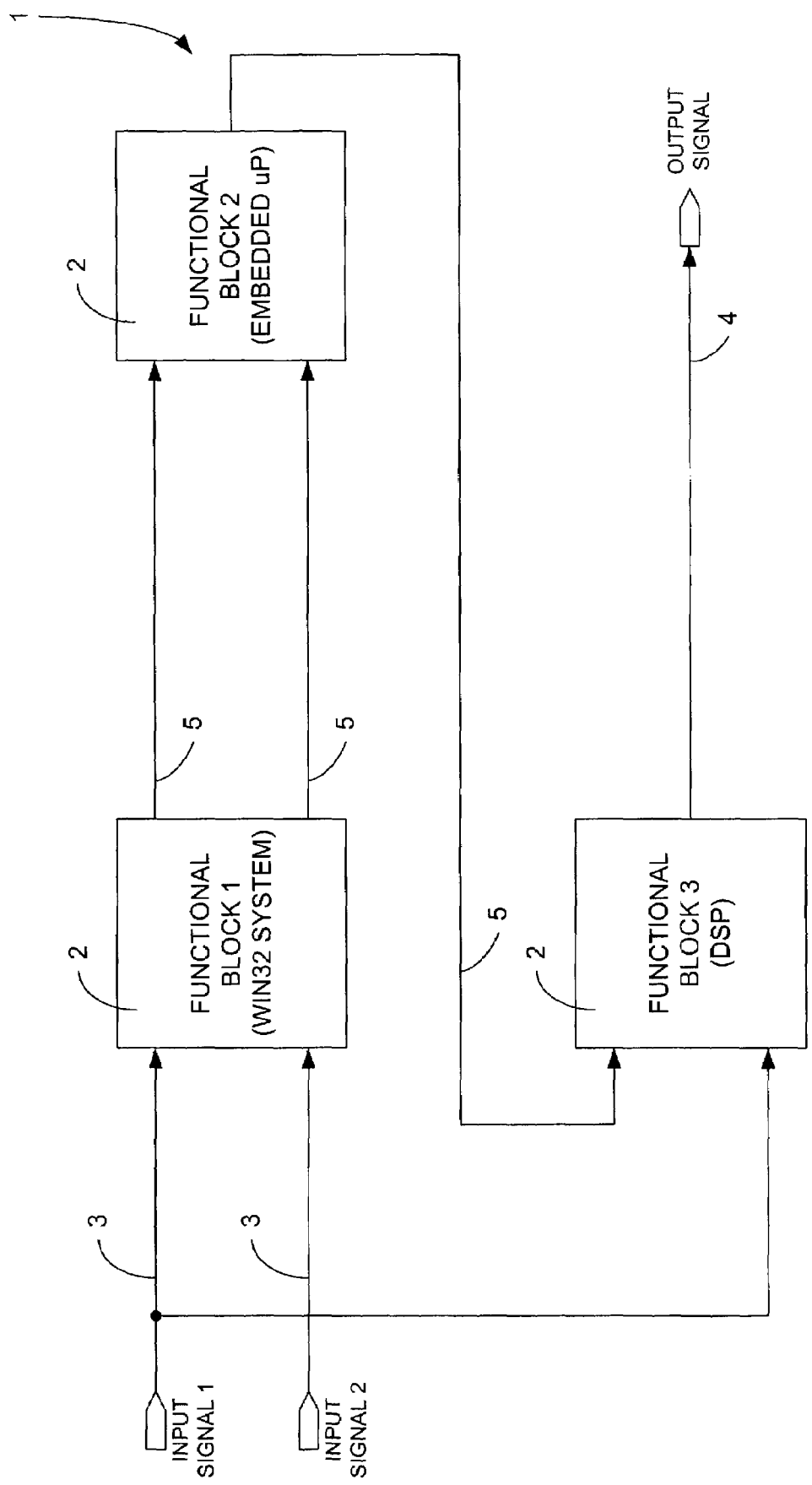
FIG. 1 is a block diagram of a system model that may be represented within the Simulink modeling environment, as well as other modeling environments.
Figure 2:
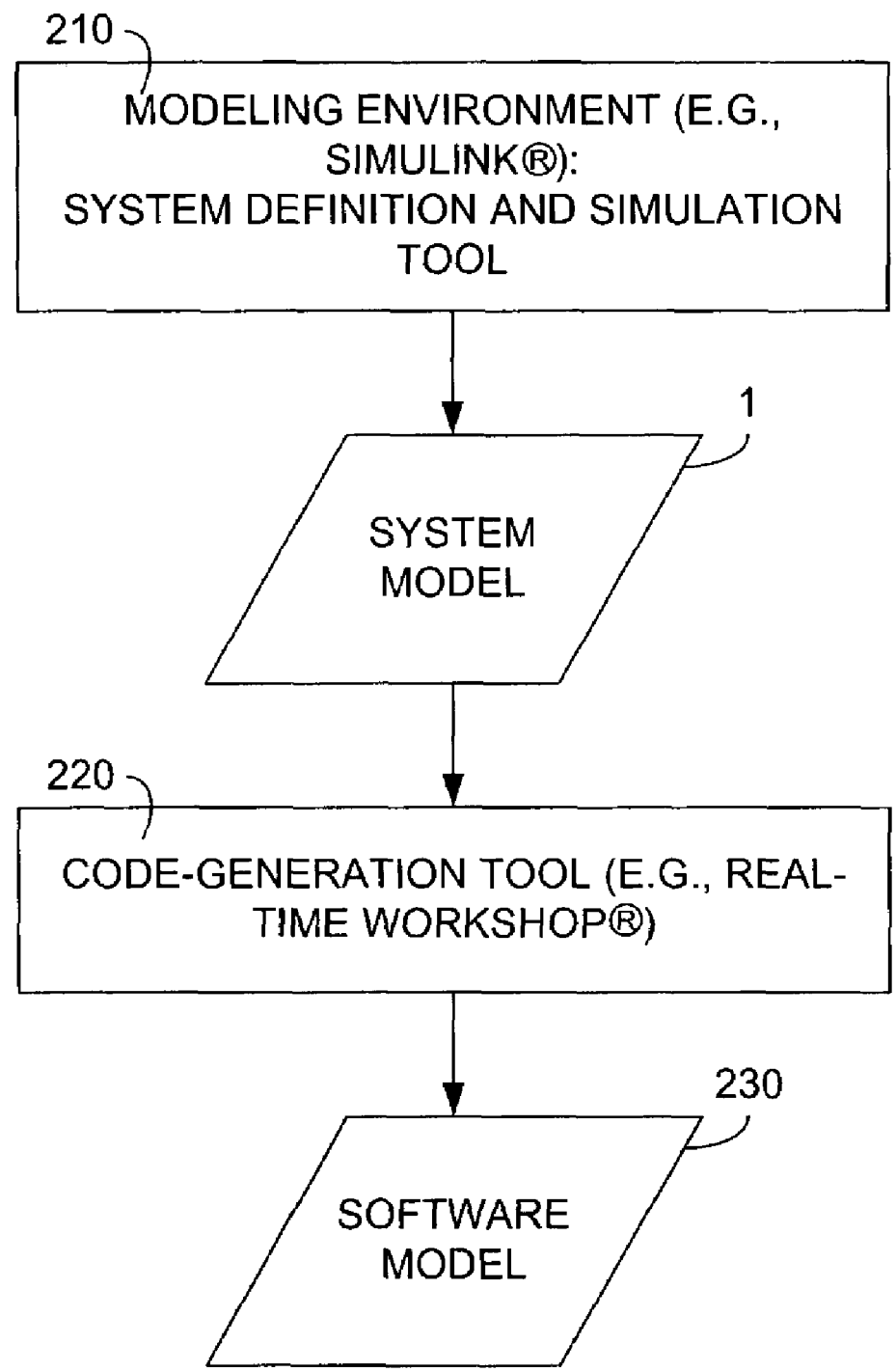
FIG. 2 is a flow chart of a method from the prior art of developing a system model and a software model of a dynamic system.
Figure 3:
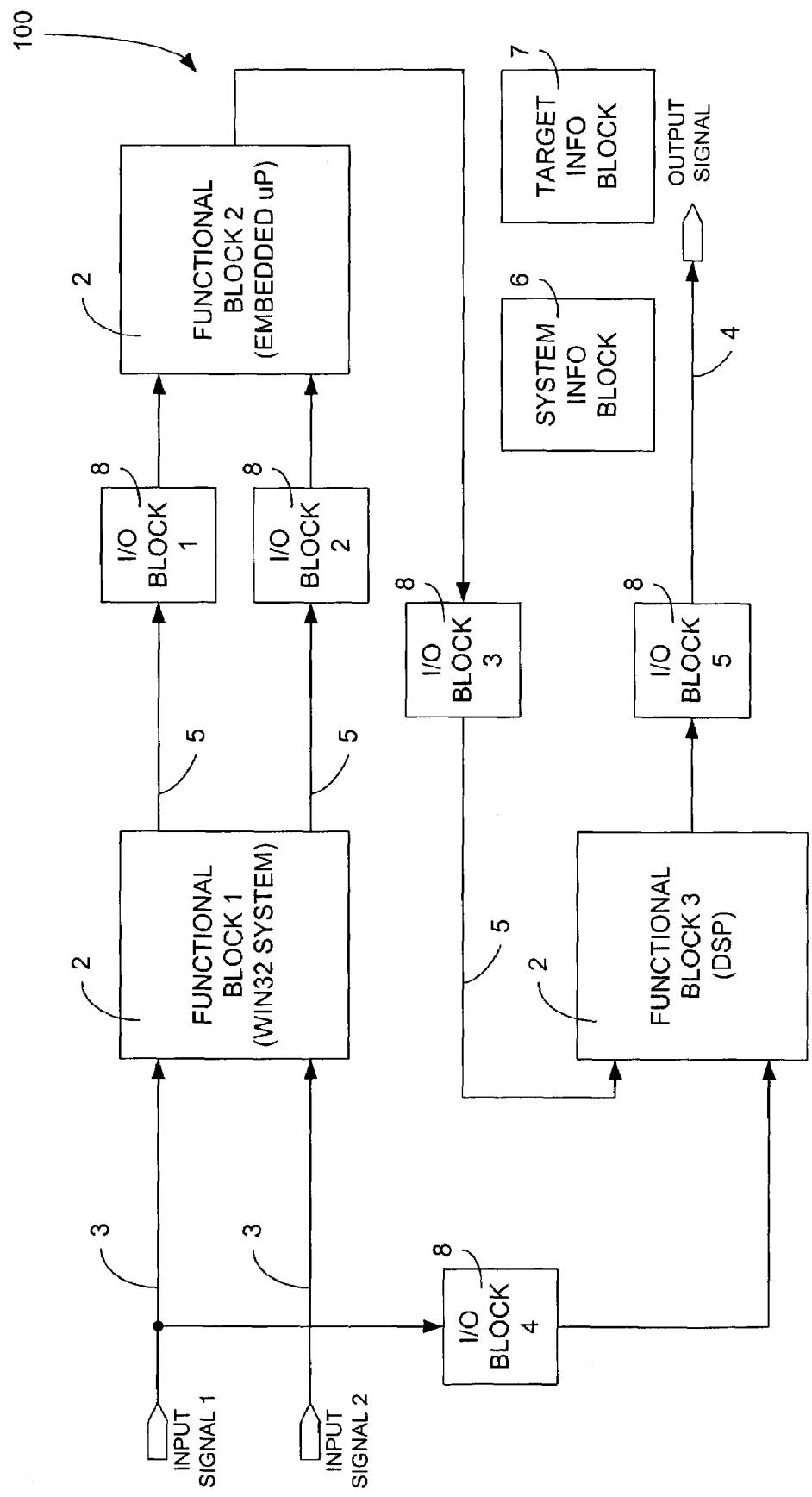
FIG. 3 is a block diagram of the system model of FIG. 1 that has been decorated by a designer according to an embodiment of the invention.

Within FIG. 4, the system designer modifies a system model 1 (from FIG. 1) by adding to, or "decorating," system model 1 with a plurality of decomposition functional blocks 6, 7, 8 (step 420 of FIG. 4), resulting in a decorated system model 100, shown in detail in FIG. 3. Each of the possible decomposition blocks 6, 7, 8 typically has a masked dialog box associated with it that is presented to the designer upon instantiation of such a block within the decorated system model 100. Such dialog boxes allow customization of the functional block with which each is associated.

The decomposition functional blocks 6, 7, 8 are comprised of several different types of blocks, each of which serves a particular purpose. For example, in the enclosed embodiments, one system information block 6 is utilized per decorated system model 100. The system information block 6 is employed to make global system information, such as the name or identifier of the overall decorated system model 100, available to all system submodels to be generated later. The designer may specify the information by way of a masked dialog box associated with it that is presented to the designer upon instantiation of the block within the decorated system model 100. The system information block 6 normally is placed within the top-level representation of the decorated system model 100, such as that represented in FIG. 3. Since the system information block 6 does not operate in a "functional" manner with the remainder of the decorated system model 100, the system information block 6 is not connected to any other functional blocks by way of internal signals to or from those blocks.

Another type of decomposition functional block provided is the target information block 7, one of which is placed at the top level for each system submodel. In the specific case of the decorated system model 100 of FIG. 3, a target information block 7 is used in the top-level description of that model. As three different system submodels are defined within the decorated system model 100, corresponding to each of FUNCTIONAL BLOCK 1 (Win32 target platform), FUNCTIONAL BLOCK 2 (embedded microprocessor target platform), and FUNCTIONAL BLOCK 3 (digital signal processor target platform), three target information blocks 7 are employed in all. FUNCTIONAL BLOCK 2 and FUNCTIONAL BLOCK 3 each contain a target information block at the next lowest level of abstraction (not shown) for each of those submodels. In this particular embodiment, FUNCTIONAL BLOCK 1 does not contain a separate target information block 7 within, as the top-level diagram shown in FIG. 3 serves as the actual top level for the Win32 submodel in this case, as denoted by the target information block 7 shown in FIG. 3. Thus, the Win 32 submodel will not only incorporate FUNCTIONAL BLOCK 1, but also input signals 3, output signals 4, and any hardware functions that will be simulated within that particular submodel. Each target information block 7 has an associated dialog box which allows the designer to name the particular system submodel represented, the identity of the overall system model with which the system submodel is related, and an indication of the particular target platform (Win32 system, DSP, field-programmable gate array (FPGA), and so on) upon which the resulting software submodel will be executed. An indication of a 'NULL' target within the dialog box indicates that the associated component of the actual system will take the place of the submodel in the decomposed simulation model. The resulting information for each target information block is stored in a "template model" for later use during generation of the system submodels.

The designer also populates the decorated system model 100 with Input/Output (I/O) blocks 8, as shown in FIG. 3, showing the location and nature of the communication links which will be used by the various system submodels to intercommunicate. Each I/O block 8 typically includes a simple I/O subsystem with input and output ports, along with I/O simulation code (not shown) and an I/O information block (also not shown). The I/O simulation code is employed when the associated submodel is utilized in a full system-level simulation. The I/O information block provides an indication of which set of code should be linked into the submodels to actually implement the I/O. The code selected by the I/O information block may be code that provides I/O communication with another submodel, or the code that provides communication with the actual component that another submodel is designed to represent. Associated with the I/O information block is a dialog box which allows the designer to indicate which set of I/O communication code should be employed. The I/O information block may also contain information regarding the target platform associated with each of the input and output ports of the I/O block for submodel intercommunication; alternately, this information may be derived during the actual generation of the system submodels, since each portion of the decorated system model 100 is associated with a target platform at that point. In the specific case of the decorated system model 100 of FIG. 3, each communication link between submodels has an I/O block 8 associated with it.

The I/O technology utilized for communication between the software submodels resulting from the system submodels may be any communication link employable within or between computing systems. For example, Component Object Model (COM) technology, devised by Microsoft Corporation(g, may be employed. COM is a widely-used software architecture definition that allows software "components," or portions of software, that have been written by separate software developers in a variety of languages to intercommunicate. Basically, the COM architecture eases integration of disparate pieces of software to perform some integrated function by defining a framework governing how those pieces will communicate with each other. Another I/O technology option is Microsoft's ".NET", which is a more comprehensive interfacing technology than COM that employs a set of eXtensible Markup Language (XML) Web services to allow interconnectivity between portions of software. Many other I/O technologies available today, such as shared memory I/O, may also be employed. In the case that the associated submodel is to communicate with an actual component of the system being simulated, the I/O technology utilized may be a hardware-specific device driver intended specifically to interface with that component.

In the disclosed embodiments relating to Simulink, the decomposition functional blocks 6, 7, 8 are implemented as "S-functions," described above. In other words, the decomposition functional blocks 6, 7, 8 are defined by way of sections of software which describe and exhibit the functionality of the associated decomposition functional blocks 6, 7, 8.

After the designer has finished the decorated system model 100, the designer initiates the process whereby the various system submodels are generated automatically. According to the enclosed embodiments, this process is carried out by a number of software scripts provided within the modeling environment 210.

Figure 5:
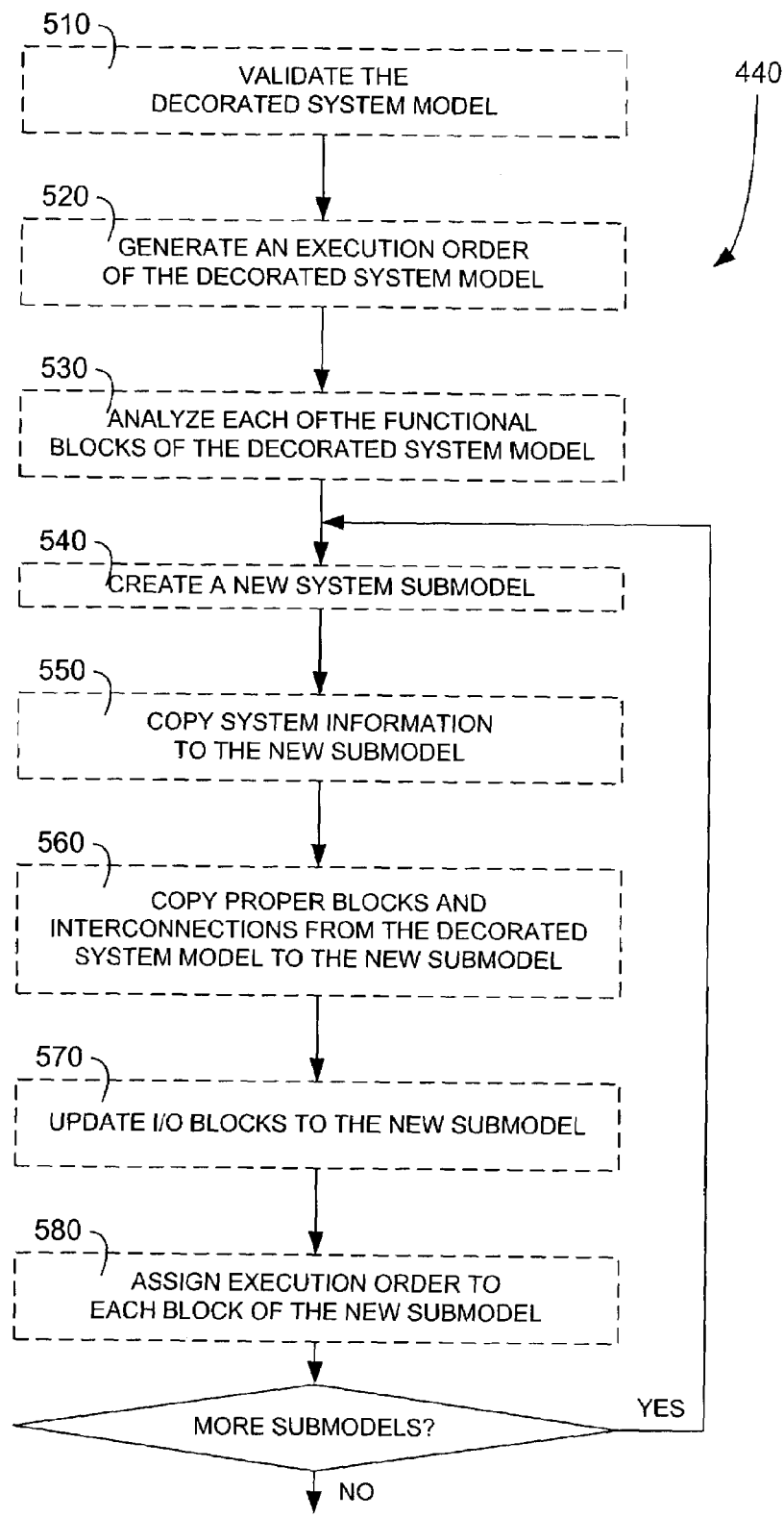
FIG. 5 is a flow chart of a method according to an embodiment of the invention of automatically generating separate system submodels from a decorated system model, as noted in FIG. 4.

The decomposition process (step 440 of FIG. 4, shown in greater detail in FIG. 5) begins with a validation of the decorated system model 100 to ensure that it can be decomposed properly into system submodels (step 510). If the decorated system model fails the validation, the decomposition process halts.

Next, the execution order of the decorated system model 100 is generated (step 520). The execution order essentially is the sequential order in which the functional blocks of the decorated system model 100 are executed for each time step during simulation. The execution order is generated from critical system-level information, such as the timing parameters and block priorities associated with the decorated system model 100, as described above. The generation of the execution order is necessary to ensure that the various functional blocks of each system submodel are executed in the proper order to avoid deadlock or other timing problems when the various submodels are executed in concert.

Each of the functional blocks of the decorated system model 100 is then analyzed so that they may be organized into the appropriate system submodels (step 530). Each I/O block 8 encountered during this step is assigned to each of the submodels with which it is associated. Each target information block 7 encountered indicates the top, or "root", block for each submodel.

Using each target information block 7, the system submodel for that target information block 7 is then generated. First, the system submodel is created using the template model information from the target information block 7 (step 540). The information stored within the system information block 6 is also copied to the new submodel to relate it back to the decorated system model 100 (step 550). All of the blocks residing under the root block for that submodel are then copied to the new submodel, along with their associated interconnections (step 560). Any I/O blocks 8 copied to the new submodel are then updated with the proper information regarding the nature of the associated communications link (step 570). Included in this step is whether each I/O block 8 is a sink or a source of data. This information is usually obtainable from the decorated system model 100, since most modeling environments, such as Simulink, indicate the direction of data flow for any internal signal 5 within a system model. Also included in this updating step is the substitution of I/O components depending on the information in the I/O block 8 regarding whether an actual component or another system submodel is being communicated with through the I/O block 8. Finally, each block within the submodel is assigned the execution order generated from the decorated system model 100 (step 580).

After each of the system submodels is generated, a system information file, which holds information concerning the decomposition of the system model into the various system submodels, is produced (step 440 of FIG. 4). In the enclosed embodiments, the system information file is in eXtensible Markup Language (XML) format, but any suitable data format may be employed. The information within this file is then subsequently used to download the resulting software submodels to their requested target platforms. Additionally, the system information file, which is sometimes referred to as the "manifest" for the system, may also include information for guiding the construction of the actual system being modeled. For example, this information may be employed to aid the ordering of electronic parts, the compilation of source code, and the like.

Each of the system submodels is then used to generate associated software submodels (step 450 of FIG. 4) that are to be transferred to the specific target platforms for which each was intended. This process is normally accomplished by way of a code-generation tool, which in the enclosed embodiments is the RTW tool from The Mathworks. Information from the template model for each system submodel aids this process. During the code generation, information regarding each of the software submodels is added to the XML system information file.

At the convenience of the designer, each of the software submodels may then be transferred to the appropriate target platforms upon which each software submodel may be executed. Typically, a service within the modeling environment 210 automatically performs this task, aided by the information previously stored within the XML system information file.

Figure 6:
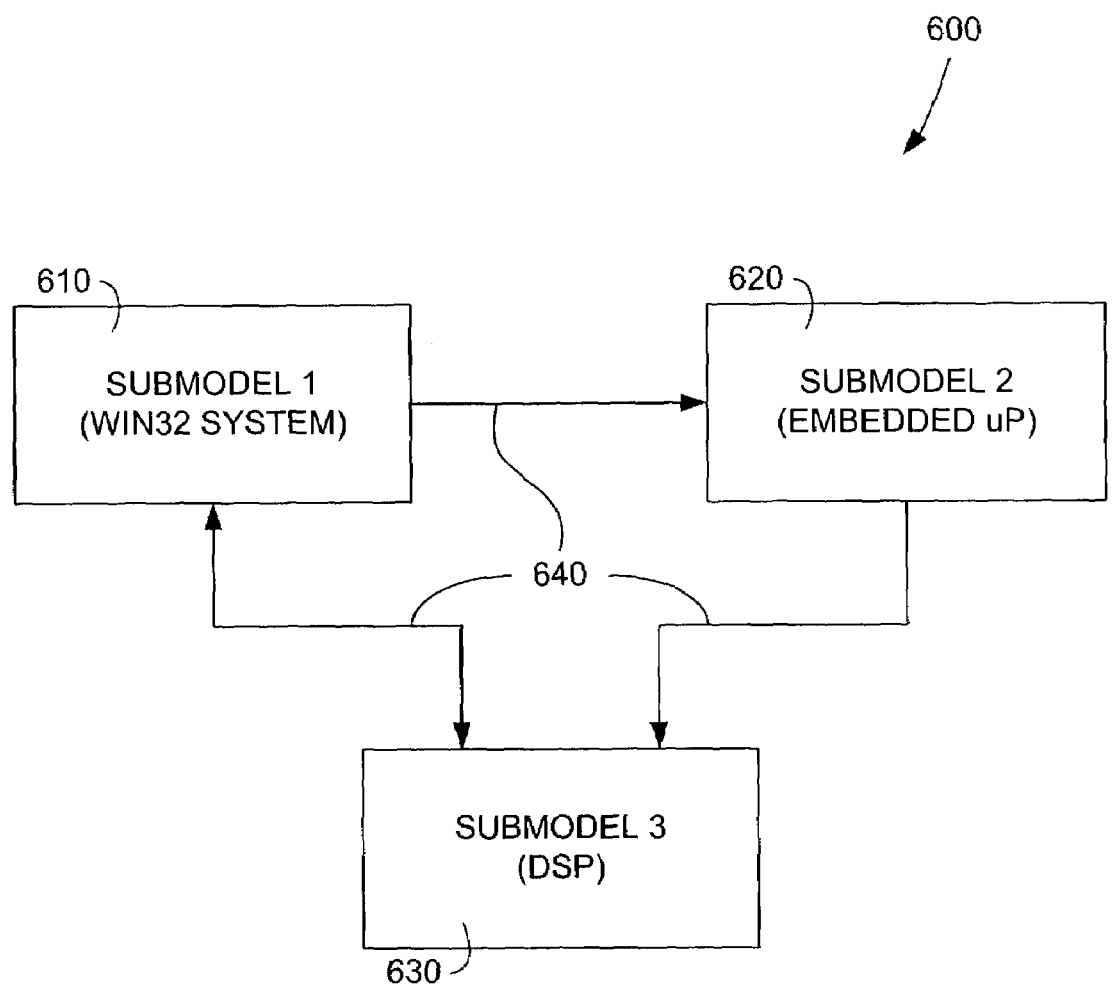
FIG. 6 is a simplified block diagram of the interrelationship of a set of software submodels generated from the decorated system model of FIG. 3 executing on diverse target platforms.

After the various software submodels have been transferred to the appropriate targets, a resulting distributed system model 600 may be executed for simulation purposes, as shown in FIG. 6. Using the specific case of the decorated system model 100 from FIG. 3, each of the three software submodels 610, 620 and 630 execute concurrently, with communication between each of the submodels 610, 620, 630 occurring via communication links 640. Given an appropriate selection of target platforms by the designer, the execution of each submodel 610, 620, 630 is potentially more efficient due to the relationship between each submodel and the selected target platform. For example, the Win32 submodel 610 would best be simulated on an actual Win32 computing system. On the other hand, the DSP software submodel 630 most likely runs most efficiently on an actual DSP system, or a DSP emulator. By decomposing the system model into separate submodels, each of which runs on a target platform that actually implements or closely approximates a portion of the production system, the resulting system-level simulation is likely to be a better representation of what will occur under normal operating conditions.

As mentioned above, another example of a potential target platform is an FPGA. FPGAs are capable of executing many computations many times faster than microprocessors. As a result, FPGAs are particularly suited for DSP applications, such as actual and simulated communications systems, resulting in greatly increased performance over other alternatives.

Additionally, since the resulting system simulation executes on multiple platforms, the overall simulation time may be reduced substantially, due to the amount of simulation processing that occurs simultaneously among the target platforms, thereby potentially reducing overall simulation time, thereby enhancing time-to-market for the actual dynamic system.

As mentioned earlier, one or more system submodels may be replaced with actual components that ultimately will be used in the dynamic system being simulated. Such substitution of actual components for submodels may further enhance the overall accuracy and efficiency of the simulation of the entire system.

From the foregoing, the embodiments of the invention discussed above have been shown to provide a method for automatically decomposing an overall dynamic system model into separate system submodels. Furthermore, other specific systems and methods embodying the invention are also possible. Therefore, the present invention is not to be limited to the specific forms so described and illustrated; the invention is limited only by the claims.

What is claimed is:

1. A method for decomposing a system model the system model having a plurality of functional blocks, the method comprising the steps of:
   a designer decorating the system model, resulting in a decorated system model having a plurality of separate portions;
   automatically generating a system submodel from the decorated system model for each of the plurality of separate portions of the decorated system model while maintaining consistency of all critical system-level information of each system submodel with the decorated system model, wherein the step decorating the system model integrates global system information, information needed for generating each system submodel, and information identifying the location and nature of communication links between the system submodels into the system model and wherein the global system information is available to the system submodels; and
   the designer identifying a target platform to be associated with each of the plurality of separate portions of the decorated system model.

2. The method of claim 1, wherein at least one of the target platforms identified in the identifying step is an actual component of the system.

3. The method of claim 1, further comprising the step of generating a software submodel from at least one system submodel for execution on the target platform associated with that system submodel.

4. The method of claim 3, further comprising the step of generating a system information file describing the automatically generating step.

5. The method of claim 4, wherein the system information file provides a mapping from the decorated system model to actual components of the system that are represented by the system submodels.

6. The method of claim 4, further comprising the step of:
   transferring each of the software submodels to its associated target platform for subsequent execution, the transferring step utilizing the system information file.

7. The method of claim 1, wherein the decorating and identifying steps are implemented by way of a system information block, at least one target information block, and at least one input/output (I/O) block.

8. The method of claim 7, wherein the automatically generating step further comprises of the substeps of:
   validating the decorated system model;
   generating an execution order of the decorated system model;
   analyzing each functional block of the decorated system model in order to organize the decorated system model into system submodels; and
   generating a system submodel for each target information block of the decorated system model.

9. A method for decomposing a system model, the system model having a plurality of functional blocks, the method comprising the steps of:
   a designer decorating the system model, resulting in a decorated system model having a plurality of separate portions;
   the designer identifying a target platform to be associated with each of the plurality of separate portions of the decorated system model,
   wherein the decorating and identifying steps are implemented by way of a system information block, at least one target information block, and at least one input/output (I/O) block; and
   automatically generating a system submodel from the decorated system model for each of the plurality of separate portions of the decorated system model while maintaining consistency of all critical system-level information of each system submodel with the decorated system model, further comprising the substeps of:
   validating the decorated system model;
   generating an execution order of the decorated system model;
   analyzing each functional block of the decorated system model in order to organize the decorated system model into system submodels; and
   generating a system submodel for each target information block of the decorated system model, wherein the system submodel generating step further comprises the substeps of:
   creating a new system submodel;
   copying the critical system-level information from the decorated system model to the new system submodel;
   copying functional blocks, including I/O blocks, and related interconnections between the functional blocks associated with the new system submodel from the decorated system model to the new system submodel;

updating the I/O blocks of the new system submodel to reflect the nature of conimunications links associated with the I/O blocks; and assigning an execution order to the functional blocks of the new system submodel that corresponds with the execution order of the decorated system model.

10. The method of claim 9, wherein the updating step further comprises the substeps of:

substituting an I/O component for each I/O block of the new system submodel depending on whether the new system submodel is communicating with another system submodel or an actual component of the system; and determining whether each I/O block of the new system submodel is a source or sink of data.

11. The method of claim 9, wherein at least one of the target platforms identified by the designer is an actual component of the system.

12. The method of claim 9, further comprising the step of generating a software submodel from at least one system submodel for execution on the target platform associated with that system submodel.

13. The method of claim 12, further comprising the step of generating a system information file describing the automatically generating step.

14. The method of claim 13, wherein the system information file provides a mapping from the decorated system model to actual components of the system that are represented by the system submodels.

15. The method of claim 13, further comprising the step of;

transferring each of the software submodels to its associated target platform for subsequent execution, the transferring step utilizing the system information file.

16. A computer system for decomposing a system model, the system model having a plurality of functional blocks, the computer system comprising:

means for a designer via I/O blocks decorating the system model, resulting in a decorated system model having a plurality of separate portions; and means for automatically generating a system submodel from the decorated system model for each of the plurality of separate portions of the decorated system model while maintaining consistency of all critical system-level information of each system submodel with the decorated system model wherein the step decorating the system model integrates global system information, information needed for generating each system submodel, and information identifying the location and nature of communication links between the system submodels into the system model and wherein the global system information is available to the system submodels.

17. The computer system of claim 16, further comprising:
means for providing a mapping from the decorated system model to actual components of the system that are represented by the system submodels.

18. The computer system of clam 16, wherein the automatically generating means further comprises:

means for validating the decorated system model;

means for generating an execution order of the decorated system model;

means for analyzing each functional block of the decorated system model in order to organize the decorated system model into system submodels;

means for generating a system submodel for each of the plurality of separate portions of the decorated system model; and means for the designer identifying a target platform to be associated with each of the plurality of separate portions of the decorated system model.

19. The computer system of claim 18 wherein at least one of the target platforms identified in the identifying step is an actual component of the system.

20. The computer system of claim 18 further comprising:
means for generating a software submodel from at least one system submodel for execution on the target platform associated with that system submodel.

21. The computer system of claim 20, further comprising:
means for transferring each of the software submodels to its associated target platform for subsequent execution.

22. A program storage device readable by a computer system, embodying a program executable by the computer system to perform method steps for decomposing a system model, the system model having a plurality of functional blocks, the method steps comprising:

a designer decorating the system model, resulting in a decorated system model having a plurality of separate portions; automatically generating a system submodel from the decorated system model for each of the plurality of separate portions of the decorated system model while maintaining consistency of all critical system-level information of each system submodel with the decorated system model, wherein the step decorating the system model integrates global system information, information needed for generating each system submodel, and information identifying the location and nature of communication links between the system submodels into the system model and wherein the global system information is available to the system submodels; and the designer identifying a target platform to be associated with each of the plurality of separate portions of the decorated system model.

23. The program storage device of claim 22, wherein at least one of the target platforms identified in the identifying step is an actual component of the system.

24. The program storage medium of claim 22, the method steps further comprising the step of:

generating a software submodel from at least one system submodel for execution on the target platform associated with that system submodel.

25. The program storage device of claim 24, the method steps further comprising the step of:

generating a system information file describing the automatically generating step.

26. The program storage device of claim 25, wherein the system information file provides a mapping from the decorated system model to actual components of the system that are represented by the system submodels.

27. The program storage device of claim 25, the method steps further comprising the step of:

transferring each of the software submodels to its associated target platform for subsequent execution, the transferring step utilizing the system information file.

28. The program storage device of claim 22, wherein the decorating and identifying steps are implemented by way of a system information block, at least one target information block, and at least one input/output (I/O) block.

29. The program storage device of claim 28, wherein the automatically generating step further comprises of the substeps of:
- validating the decorated system model;
- generating an execution order of the decorated system model;
- analyzing each functional block of the decorated system model in order to organize the decorated system model into system submodels; and
- generating a system submodel for each target information block of the decorated system model.

30. A program storage device readable by a computer system, embodying a program executable by the computer system to perform method steps for decomposing a system model, the system model having a plurality of functional blocks, the method steps comprising:
- a designer decorating the system model, resulting in a decorated system model having a plurality of separate portions;
- the designer identifying a target platform to be associated with each of the plurality of separate portions of the decorated, system model,
- wherein the allowing decorating and identifying steps are implemented by way of a system information block, at least one target information block, and at least one input/output (I/O) block; and
- automatically generating a system submodel from the decorated system model for each of the plurality of separate portions of the decorated system model while maintaining consistency of all critical system-level information of each system submodel with the decorated system model, further comprising the substeps of:
  - validating the decorated system model;
  - generating an execution order of the decorated system model;
  - analyzing each functional block of the decorated system model in order to organize the decorated system model into system submodels; and
  - generating a system submodel for each target information block of the decorated system model, wherein the system submodel generating step further comprises the substeps of:
    - creating a new system submodel;
    - copying the critical system-level information from the decorated system model to the new system submodel;
    - copying functional blocks, including I/O blocks, and related interconnections between the functional blocks associated with the new system submodel from the decorated system model to the new system submodel;
    - updating the I/O blocks of the new system submodel to reflect the nature of communications links associated with the I/O blocks; and
    - assigning an execution order to the functional blocks of the new system submodel that corresponds with the execution order of the decorated system model.

31. The program storage device of claim 30, wherein the updating step further comprises the substeps of:
- substituting an I/O component for each I/O block of the new system submodel depending on whether the new system submodel is communicating with another system submodel or an actual component of the system; and
- determining whether each I/O block of the new system submodel is a source or sink of data.

32. The program storage device of claim 30, wherein at least one of the target platforms identified by the designer is an actual component of the system.

33. The program storage device of claim 30, the method steps further comprising the step of:
- generating a software submodel from at least one system submodel for execution on the target platform associated with that system submodel.

34. The program storage device of claim 33, the method steps further comprising the step of:
- generating a system information file describing the automatically generating step.

35. The program storage device of claim 34, wherein the system information file provides a mapping from the decorated system model to actual components of the system that are represented by the system submodels.

36. The program storage device of claim 34, the method steps further comprising the step of:
- transferring each of the software submodels to its associated target platform for subsequent execution, the transferring step utilizing the system information file.

* * * * *

UNITED STATES PATENT AND TRADEMARK OFFICE
CERTIFICATE OF CORRECTION

PATENT NO.         : 7,194,726 B2                                    Page 1 of 1
APPLICATION NO.    : 10/272064
DATED              : March 20, 2007
INVENTOR(S)        : Allen et al.

It is certified that error appears in the above-identified patent and that said Letters Patent is hereby corrected as shown below:

Column 10, line 8, in Claim 4, after "step of" insert -- : --.

Column 11, line 5, in Claim 9, delete "conimunications" and insert -- communications --, therefor.

Column 11, line 35, in Claim 15, after "step of" delete ";" and insert -- : --, therefor.

Column 11, line 63 (Approx.), in Claim 18, delete "clam" and insert -- claim --, therefor.

Column 13, line 23, in Claim 30, after "wherein the" delete "allowing".

Column 13, line 44, in Claim 30, delete "infonnation" and insert -- information --, therefor.

Column 14, line 4, in Claim 30, delete "thedecorated" and insert -- the decorated --, therefor.

Signed and Sealed this

Tenth Day of July, 2007

JON W. DUDAS
*Director of the United States Patent and Trademark Office*